(12) United States Patent
Berquist et al.

(10) Patent No.: US 8,031,010 B1
(45) Date of Patent: Oct. 4, 2011

(54) RUGGEDIZED CHIP SCALE ATOMIC CLOCK

(75) Inventors: Roy W. Berquist, Fort Wayne, IN (US);
Robert A. Newgard, Central City, IA (US); Joseph M. Bohl, Cedar Rapids, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 80 days.

(21) Appl. No.: 12/566,481

(22) Filed: Sep. 24, 2009

(51) Int. Cl.
*H03B 1/00* (2006.01)
*H03B 5/00* (2006.01)
*H03B 5/04* (2006.01)
*H03B 5/36* (2006.01)
*H03B 21/00* (2006.01)
*H03B 21/01* (2006.01)
*H03L 1/02* (2006.01)
*H03L 7/26* (2006.01)

(52) U.S. Cl. .................. 331/49; 331/3; 331/37; 331/40; 331/41; 331/66; 331/69; 331/158; 331/173

(58) Field of Classification Search ................ 331/3, 18, 331/25, 37, 40, 41, 46, 49, 65, 66, 68, 69, 331/94.1, 158, 159, 172, 173, DIG. 2
See application file for complete search history.

(56) References Cited

U.S. PATENT DOCUMENTS

| 4,513,259 A | * | 4/1985 | Frerking ................... 331/176 |
| 5,717,402 A | * | 2/1998 | Chu ..................... 342/357.27 |

* cited by examiner

*Primary Examiner* — David Mis
(74) *Attorney, Agent, or Firm* — Daniel M. Barbieri

(57) ABSTRACT

The present invention is a Chip Scale Atomic Clock (CSAC)-enabled Time and Frequency Standard (CTFS) architecture. The CTFS architecture includes a microcontroller, a Time Compensated Crystal Oscillator (TCCO) circuit which is connected to the microcontroller, and a Chip Scale Atomic Clock (CSAC) which is connected to the microcontroller. The microcontroller is configured for selectively causing the CTFS to provide a TCCO circuit-based output frequency when the CTFS has not locked to a predetermined atomic resonance, and is further configured for causing the CTFS to provide a CSAC-based output frequency when the CTFS has locked to a predetermined atomic resonance.

20 Claims, 5 Drawing Sheets

RUGGEDIZED CHIP SCALE ATOMIC CLOCK

FIELD OF THE INVENTION

The present invention relates to the field of advanced radio systems and particularly to a ruggedized chip scale atomic clock (ex.—for radio systems).

BACKGROUND OF THE INVENTION

Current radio systems may not provide a desired level of performance.

Thus, it would be desirable to provide a ruggedized chip scale atomic clock (ex.—for radio systems) which obviates problems associated with current solutions.

SUMMARY OF THE INVENTION

Accordingly, an embodiment of the present invention is directed to a method for providing a frequency output via a CSAC-enabled Time and Frequency Standard (CTFS) architecture, the method including: providing an output frequency signal from an SC oscillator to both a first NOT gate and to a microcontroller; providing an output frequency signal from a VCXO to a second NOT gate; receiving the SC oscillator output frequency signal at the first NOT gate and, based upon the received SC oscillator output frequency signal, providing an output from the first NOT gate to a mixer; receiving the VCXO oscillator output frequency signal at the second NOT gate and, based upon the received VCXO oscillator output frequency signal, providing an output from the second NOT gate to the mixer; receiving the first NOT gate output and the second NOT gate output at the mixer and, based upon the received first NOT gate output and the received second NOT gate output, providing a mixer output to the microcontroller; providing a temperature indicator signal from the SC oscillator to a temperature sensor; receiving the temperature indicator signal at the temperature sensor and, based upon the received temperature indicator signal, providing a temperature sensor output to a first ADC; receiving the temperature sensor output at the first ADC and, based upon the received temperature sensor output, providing an ADC output signal from the first ADC to the microcontroller; receiving the ADC output signal at the microcontroller and, based upon the received ADC output signal, providing a TCCO-based output frequency adjustment signal from the microcontroller to a first DAC; receiving the TCCO-based output frequency adjustment signal from the microcontroller at the first DAC and, based upon the TCCO-based output frequency adjustment signal, providing a frequency adjustment signal from the first DAC to the VCXO; receiving the DAC-provided frequency adjustment signal at the VCXO and, based upon the DAC-provided frequency adjustment signal, providing an adjusted VCXO output frequency; providing an oven current output signal from the microcontroller to the physics package; receiving the oven current output signal at the physics package and, based upon the received oven current output signal, providing a thermistor output signal from the physics package to the microcontroller; receiving the thermistor output signal at the microcontroller and adjusting oven current output signal outputs based upon the received thermistor output signal; based upon the received oven current output signal, providing a photodetector output signal from the physics package to an amplifier circuit; receiving the photodetector output signal from the physics package at the amplifier circuit; amplifying, splitting, filtering, and converting the received photodetector output signal to provide output signals from ADCs of the amplifier circuit to the microcontroller, said output signals being based upon the received photodetector output signal; receiving the output signal(s) of the amplifier circuit ADCs at the microcontroller and, based upon the received amplifier circuit ADC output signals, providing a first microcontroller output signal from the microcontroller to a second DAC and providing a second microcontroller output signal from the microcontroller to a phase lock loop; receiving the microcontroller's first output signal at the second DAC and, based upon the received first microcontroller output signal, providing an output signal from the second DAC to a Bias T; receiving the microcontroller's second output signal at the phase lock loop and, based upon the received second microcontroller output signal and the SC oscillator output signal, providing an output signal from the phase lock loop to a VCO; receiving the output signal from the phase lock loop at the VCO and, based upon the received phase lock loop output signal, providing a VCO output signal to the Bias T and the phase lock loop; based on the received VCO output signal, providing a signal from the phase lock loop to the VCO for causing the VCO to provide an adjusted VCO output; receiving the output signal from the VCO and the output signal from the second DAC at the Bias T and, based upon said received signals, providing a Bias T output signal from the Bias T to the physics package; receiving the Bias T output signal at the physics package; providing an updated photodetector output signal from the physics package to the amplifier circuit, the updated photodetector output signal including a status indicator, said status indicator indicating that atomic resonance has been achieved by the physics package; receiving the updated photodetector output signal at the amplifier circuit; amplifying, splitting, filtering, and converting the received updated photodetector output signal to provide updated output signals from ADCs of the amplifier circuit to the microcontroller, said updated output signals being based upon the received updated photodetector output signal; receiving the updated output signals of the ADCs at the microcontroller and, based upon the received updated ADC output signals, providing a first updated microcontroller output signal from the microcontroller to the second DAC and providing a second updated microcontroller output signal from the microcontroller to the phase lock loop; providing a CSAC-based output frequency adjustment signal to the first DAC; receiving the CSAC-based output frequency adjustment signal at the first DAC and, based upon the received CSAC-based output frequency adjustment signal, providing an analog CSAC-based output frequency adjustment signal from the first DAC to the VCXO; and receiving the analog CSAC-based output frequency adjustment signal at the VCXO and, based upon the received analog CSAC-based output frequency adjustment signal, providing a CSAC-based VCXO output frequency.

A further embodiment of the present invention is directed to a Chip Scale Atomic Clock (CSAC)-enabled Time and Frequency Standard (CTFS) architecture, including: a microcontroller; a Time Compensated Crystal Oscillator (TCCO) circuit, the TCCO circuit being connected to the microcontroller; and a Chip Scale Atomic Clock (CSAC), the CSAC being connected to the microcontroller, wherein the microcontroller is configured for selectively causing the CTFS to provide a TCCO circuit-based output frequency when the CTFS has not locked to a predetermined atomic resonance, and is further configured for causing the CTFS to provide a CSAC-based output frequency when the CTFS has locked to a predetermined atomic resonance.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The precise position, navigation and time information available through Global Positioning System (GPS) has enabled dramatic tactical advantage to military forces and has led to widespread exploitation in navigation, communication, and networking systems. However, the low power of the GPS signal and the need for acquisition of multiple satellites may result in potential denial of GPS connectivity due to environmental or electromagnetic interference. Such denial may often result in significant or even total loss of functionality of systems relying on the GPS-supplied time base. In situations where it may be desired to intentionally disable receiver functions to reduce electromagnetic signatures, rapid reacquisition of GPS-supplied information may be impacted by accumulated time error that develops during autonomous operation. To increase robustness, operational reliability, and functional capabilities of these GPS-reliant systems, it may become critical to preserve a precision time and frequency reference even in the absence of GPS reception. Current tactical systems (ex.—Satellite Communications (SATCOM) radios, which may require a very accurate Time of Day (TOD)) which are implementing quartz-based standards may be hampered by poor long-term frequency stability/may exhibit aging over time and may have repeatability problems at colder temperatures. Alternatively, current tactical systems implementing atomic standards may have high size, weight and power (SWaP), may have limitations at higher temperatures, and may be slow to warm-up and come to the required frequency accuracy.

The herein disclosed embodiment(s) of the present invention may combine a Time Compensated Clock Oscillator architecture with a Chip Scale Atomic Clock (CSAC) to provide an architecture which allows for construction of/which may be implemented as part of a fast warm-up, wide temperature time/frequency source which relies upon the combined strengths of the two technologies to improve the performance of each of the two technologies.

Figure 1:
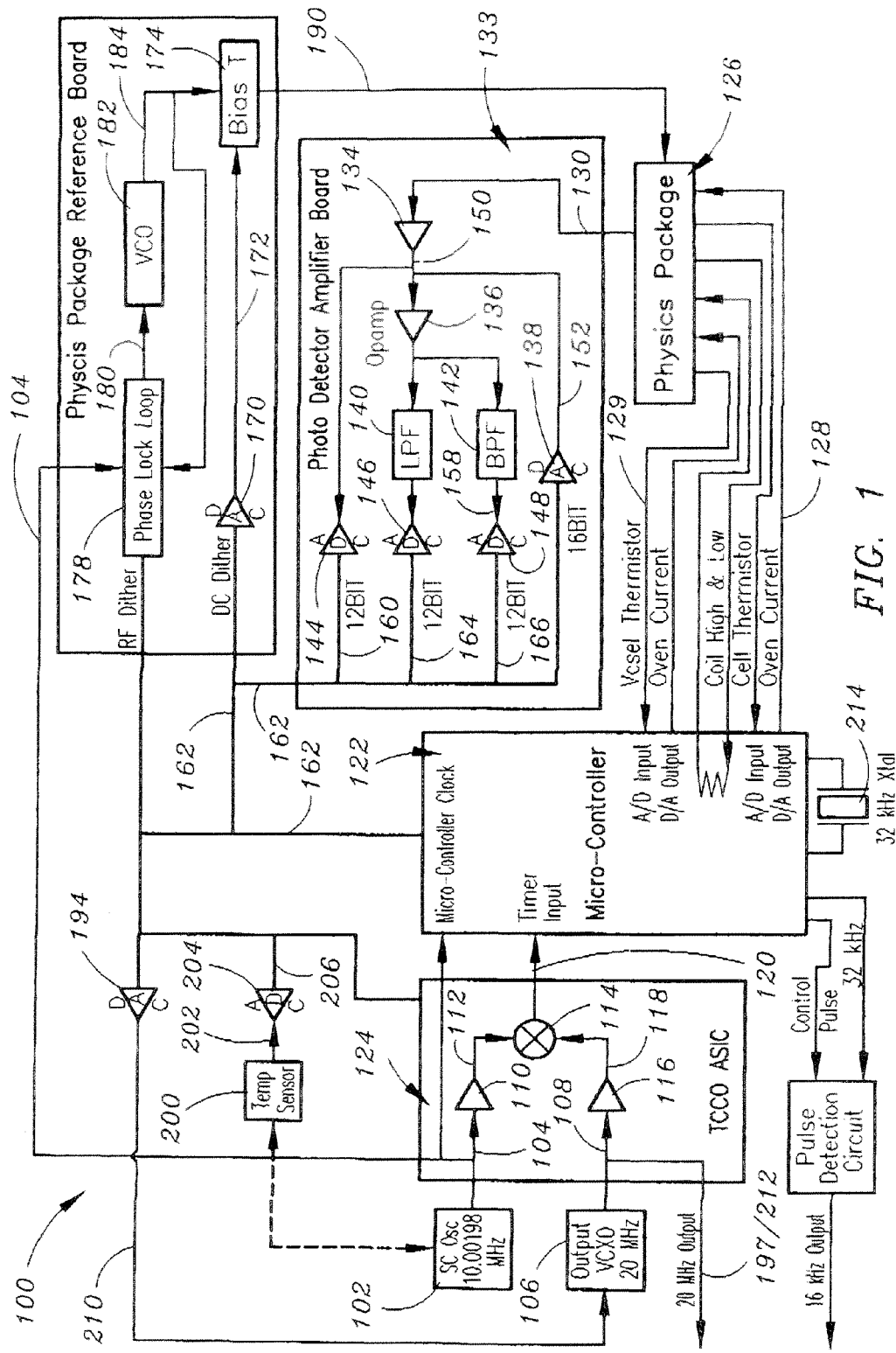
FIG. 1 is a block diagram illustration of a CSAC-enabled Time and Frequency Standard (CTFS) architecture in accordance with an exemplary embodiment of the present invention.
Figure 2A:
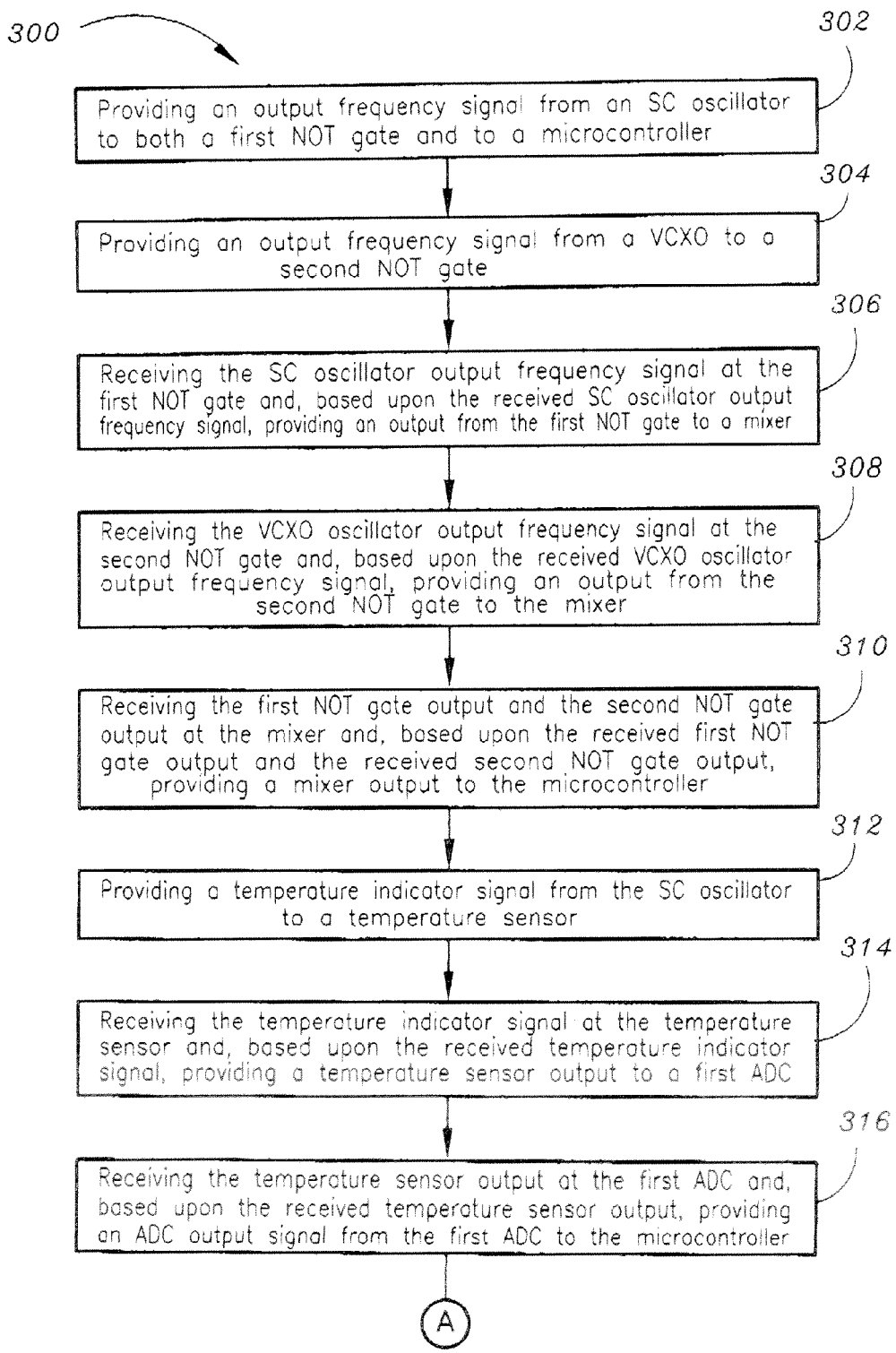
FIGS. 2A-2D are a flow chart illustrating a method for providing a frequency output via the CTFS architecture of FIG. 1 in accordance with an exemplary embodiment of the present invention.
Figure 2B:
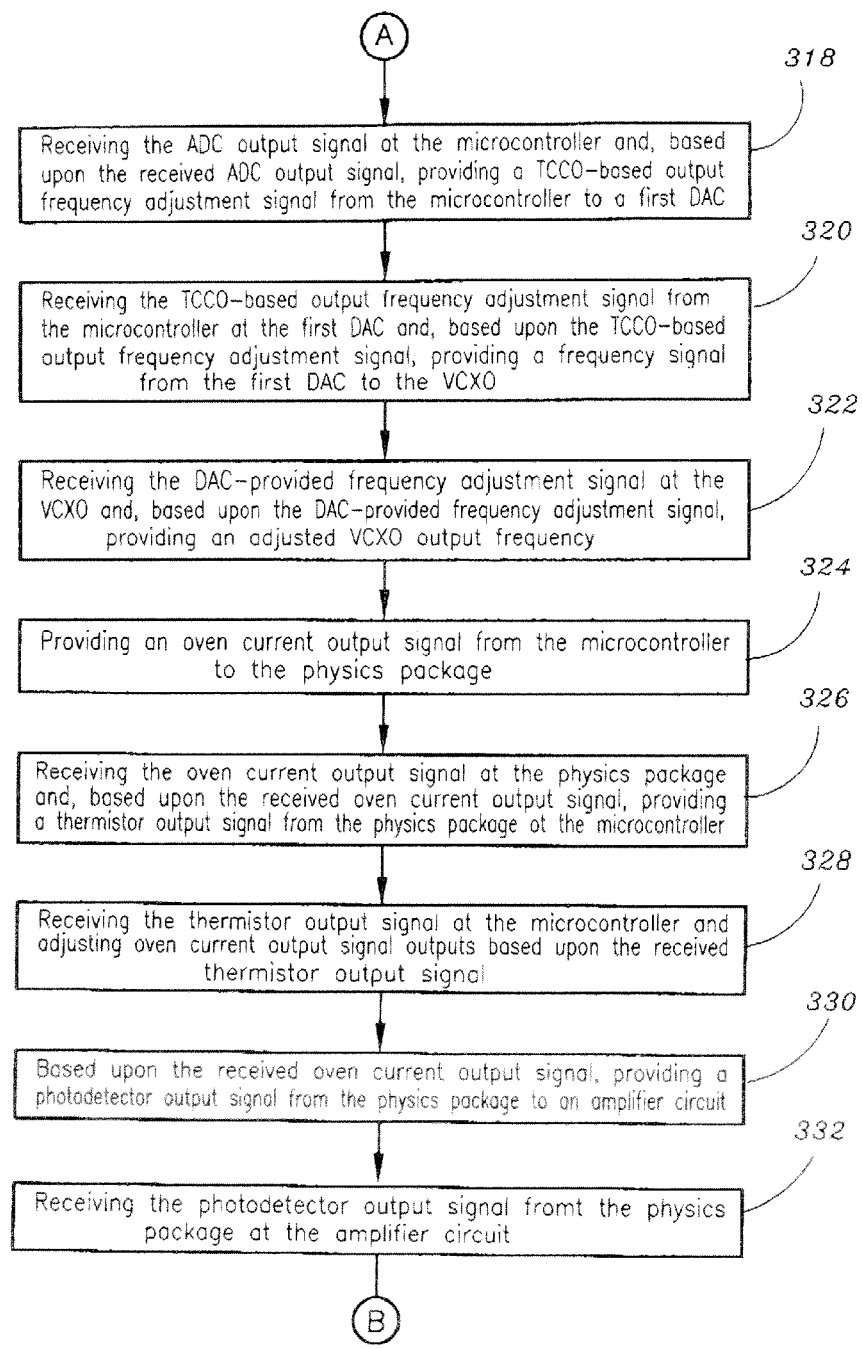
Figure 2C:
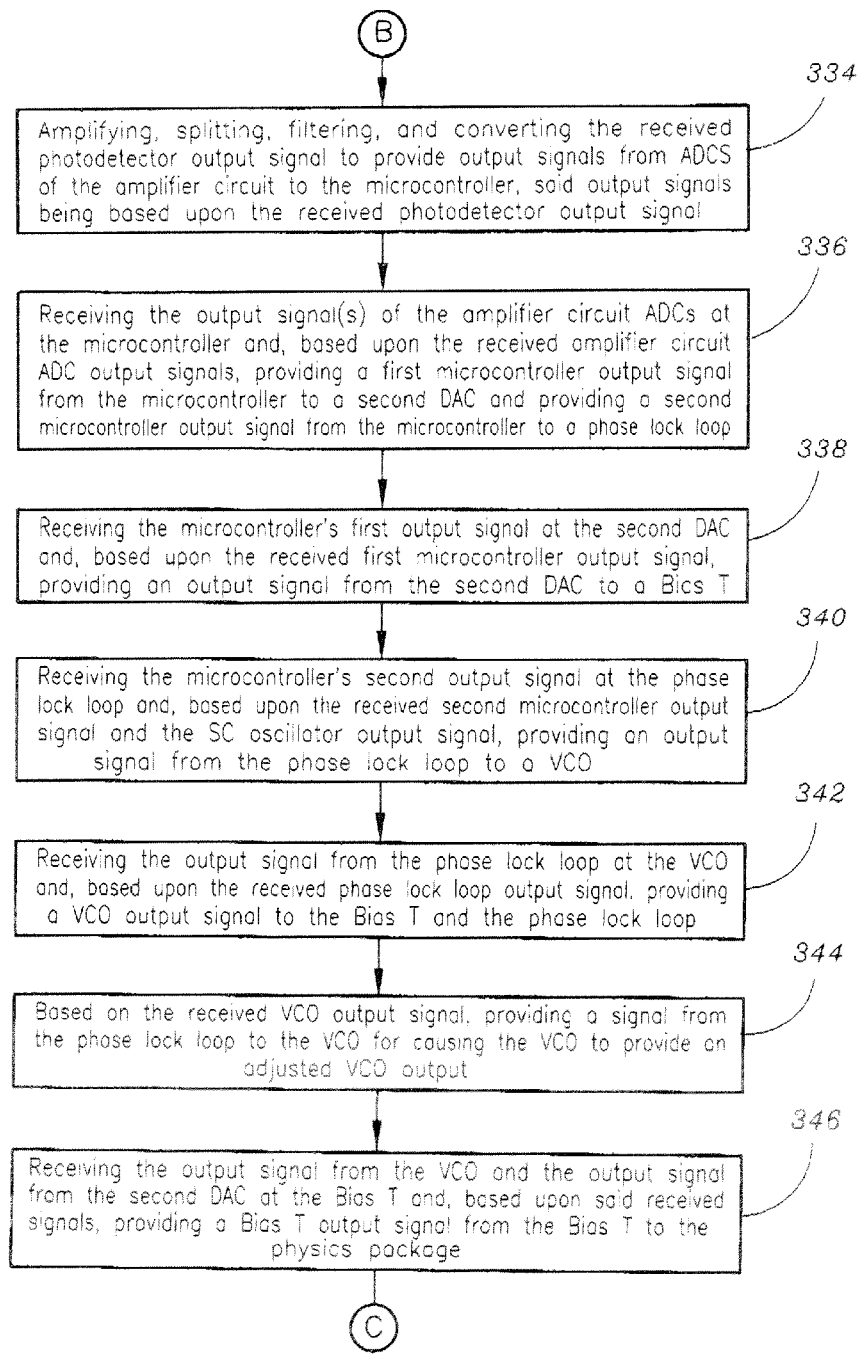
Figure 2D:
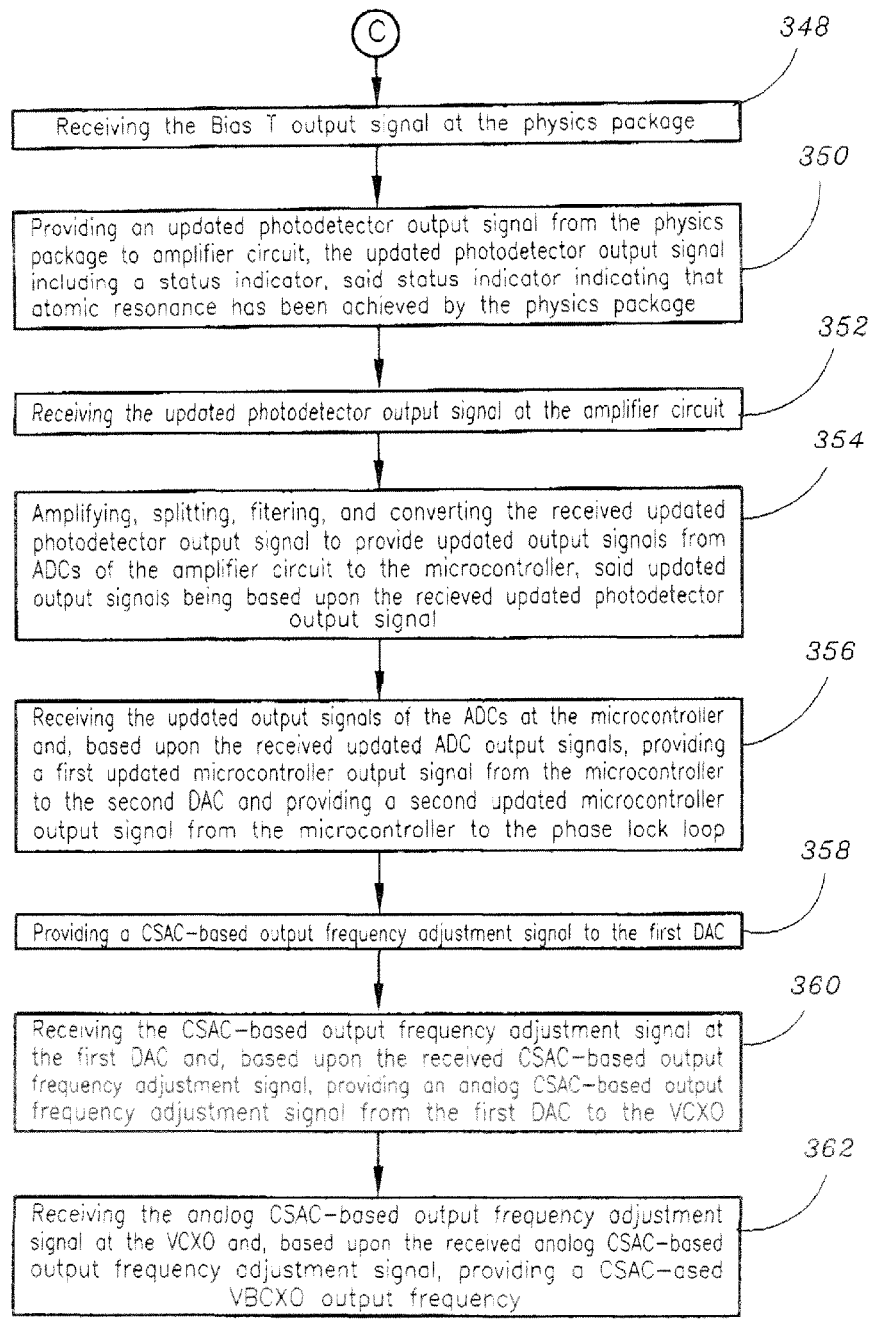

Referring to FIG. 1, a CSAC-enabled Time and Frequency Standard (CTFS) architecture configured for functioning as a highly-stable long-term clock as well as a low phase noise frequency standard in accordance with an exemplary embodiment of the present invention is shown. The CTFS architecture 100 may include/may implement a Stress Compensated (SC) oscillator 102. For example, the SC oscillator 102 may be a high-Q (ex.—approximately 2,000,000) premium swept quartz crystal using an SC cut. Further, the SC oscillator 102 may be a reference oscillator configured for providing an output frequency/output frequency signal 104 (ex.—10.001936 to 10.00198 Megahertz (MHz)). This crystal/reference oscillator 102 may provide excellent aging characteristics and temperature repeatability. Because of its high Q, the SC-cut reference oscillator 102 may not be pulled to frequency.

In further embodiments, the CTFS architecture 100 may include/may implement a Voltage Controlled Crystal Oscillator (VCXO) 106, which may include/may implement a second, low noise AT-cut crystal. The VCXO 106 may be connected to the SC oscillator 102. The VCXO 106 may be configured for providing an output frequency/output frequency signal 108 (ex.—10 MHz to 20 MHz) for the CTFS architecture 100/circuit. Further, the CTFS architecture 100 may be configured for storing temperature characteristics of the SC-cut reference oscillator crystal 102. The stored temperature characteristics of the SC-cut reference oscillator crystal 102 may be used for correcting temperature-induced changes in the output frequency provided by the VCXO 106. Thus, in the CTFS architecture/circuit 100, each crystal is optimized for its required function.

In the illustrated embodiment, the SC oscillator 102 may be configured for providing its output frequency/output frequency signal 104 to a first NOT gate 110, the first NOT gate 110 being connected to the SC oscillator 102. The first NOT gate 110 may be configured for providing an output 112 to a mixer 114, the mixer 114 being connected to the first NOT gate 110. The first NOT gate's output 112 may be based upon the SC oscillator output frequency signal 104. Further, the VCXO 106 may be configured for providing its output frequency signal 108 to a second NOT gate 116, the second NOT gate 116 being connected to the VCXO 106. The second NOT gate 116 may be configured for providing an output 118 to the mixer 114, the mixer 114 being connected to the second NOT gate 116. The second NOT gate's output 118 may be based upon the VCXO output frequency signal 108. Still further, the mixer 114 may be configured for providing a mixer output 120. The mixer output 120 may be based upon the first NOT gate output 112 and the second NOT gate output 118.

In exemplary embodiments, the SC Oscillator 102, the VCXO 106, the first NOT gate 110, the second NOT gate 116, and the mixer 114 may be included with/may be implemented with/may be implemented as part of/may provide a Time Compensated Crystal Oscillator (TCCO)/TCCO Application Specific Integrated Circuit/TCCO circuitry/TCCO-based crystal oscillator 124.

In further embodiments, the CTFS architecture 100 may include a microcontroller 122. The microcontroller 122 may be connected to the mixer 114 and may be configured for receiving the mixer output 120 (ex.—the mixer output 120 may be/may serve as a timer input signal for the microcontroller 122). The microcontroller 122 may be connected to the SC oscillator 102 and may be configured for receiving the SC oscillator output 104 (ex.—the SC oscillator output 104 may be/may serve as a clock signal for the microcontroller 122).

In the illustrated embodiment, the CTFS architecture 100 may further include a physics package 126. The physics package 126 may be connected to the microcontroller 122. For example, the physics package 126 may be a Chip Scale Atomic Clock (CSAC) physics package. The physics package 126 may be a modular CSAC physics package based on a micro-machined vapor cell filled with Rubidium-87 (Rb-87) and buffer gas of a precise pressure and composition for minimizing the temperature coefficient of clock frequency. In alternative embodiments, the vapor cell may be filled with a different element, such as Cesium. The vapor cell of the physics package 126 may be interrogated with a vertical cavity surface emitting laser (VCSEL) operating at 795 nanometers (nm) (Rb-87 D1 line). The combination of the Rb alkali species and D1 optical transition provides the highest stability configuration for the coherent population trapping (CPT) operation of the physics package 126.

In exemplary embodiments, micro-structured optics may be used in the architecture 100 to achieve a fully collimated 2 millimeter (mm) beam for full interrogation of the vapor cell contents with optimal beam polarization. Such configuration may maximize microwave resonance signal contrast and may provide best frequency stability at a given set of physics package dimensions (ex.—9×9×16 mm). The transmitted light may be detected by a photodetector of the physics package 126 to monitor the atomic resonance fundamental to the CPT operation. Use of low thermal dissipation supports, reflective shielding and vacuum packaging may minimize thermal losses, and hence power consumption, of the thermally-biased cell/vapor cell and VCSEL. For instance, the CSAC physics package 126 may provide power dissipation levels below 10 milliwatts (mW).

In further embodiments, the microcontroller 122 may be configured for generating/providing one or more oven current output signals 128 (ex.—12 bit digital-to-analog output signals). The physics package 126 may be configured for receiving the oven current output signals 128 from the microcontroller 122. The received oven current output signals 128 may cause power to be applied to heaters/ovens of the physics package 126 for warming-up the ovens of the physics package 126 and for biasing the vapor cell and VCSEL of the physics package 126 to their operating temperatures/target operating temperatures. The physics package 126 may be configured for providing one or more thermistor output signals 129 to the microcontroller 122. The microcontroller 122 may receive the thermistor output signals 129 and, based upon information provided by the received thermistor output signals 129, may provide/may continue to provide/may discontinue providing oven current output signals for adjusting/biasing the vapor cell and VCSEL of the physics package 126 to their operating temperatures/target operating temperatures.

In the illustrated embodiment, the physics package 126 may be configured for providing a photodetector output signal 130 to an amplifier circuit 132, the amplifier circuit 132 being connected to the physics package 126, the amplifier circuit being implemented on/being implemented as part of a photodetector amplifier board 133. The photodetector output signal 130 may include information related to atomic resonance/CPT operation of the physics package 126. The amplifier circuit 132 may include a first amplifier 134 and a second amplifier 136. For example, the second amplifier 136 may be an operational amplifier (Opamp). The amplifier circuit 132 may further include a first Digital-to-Analog converter (DAC) 138, a first filter 140 (ex.—a 200 Hz, 4 pole, Lowpass filter), a second filter 142 (ex.—a 5 kHz, 4 pole, Bandpass filter), a first Analog-to-Digital converter (ADC) 144 (ex.—a Coarse Adjust ADC), a second ADC 146 (ex.—a Radio Frequency (RF) Adjust ADC), and a third ADC 148 (ex.—a Fine Adjust ADC).

In exemplary embodiments, the first amplifier 134 is configured for receiving the photodetector output signal 130. Further, the first amplifier 134 may be configured for providing an output signal 150 to the second amplifier/operational amplifier 136, the first amplifier's output signal 150 being based upon the received photodetector output signal 130. The first amplifier 134 may be further configured for providing the output signal 150 to the first ADC 144. Still further, the first DAC 138 may be configured for providing an output signal 152 to the operational amplifier 136. The operational amplifier 136 may be configured for providing an output signal to the first filter 140 and the second filter 142, the operational amplifier output signal being based, for example, upon the first amplifier's output signal 150 and the first DAC's output signal 152.

In further embodiments, the first filter 140 may be configured for receiving the operational amplifier output signal. The first filter 140 may be further configured for providing an output signal 156 to the second ADC 146, the first filter's output signal 156 being based upon the received operational amplifier output signal. The second filter 142 may be further configured for providing an output signal 158 to the third ADC 148, the second filter's output signal 158 being based upon the received operational amplifier output signal.

In the illustrated embodiment, the first ADC 144 may be configured for receiving the first amplifier's output signal 150. The first ADC 144 may be further configured for providing an output signal 160 to the microcontroller 122 via one or more control lines 162 of the architecture 100, the first ADC's output signal 160 being based upon the received first amplifier's output signal 150. The second ADC 146 may be configured for receiving the first filter's output signal 156. The second ADC 146 may be further configured for providing an output signal 164 to the microcontroller 122 via the one or more control lines 162, the second ADC's output signal 164 being based upon the received first filter output signal 156. The third ADC 148 may be configured for receiving the second filter's output signal 158. The third ADC 148 may be further configured for providing an output signal 166 to the microcontroller 122 via the one or more control lines 162, the third ADC's output signal 166 being based upon the received second filter output signal 158.

In exemplary embodiments, the microcontroller 122 may be configured for receiving the first ADC's output signal 160, the second ADC's output signal 164, and the third ADC's output signal 166 from the amplifier circuit 132. Based on the received signals (160, 164, 166), the microcontroller 122 may be configured for providing an output signal to a second Digital-to-Analog converter (DAC) 170 via the one or more control line(s) 162. Further, the second DAC 170 may be configured for receiving the microcontroller's output signal and for providing an output signal 172 (ex.—a current modulation signal) to a Bias T 174, the second DAC's output signal 172 being based upon the microcontroller output signal.

In further embodiments, the microcontroller 122 may be configured for providing an output signal via the one or more control lines 162 to a phase lock loop 178, the output signal being based upon the received ADC output signals (160, 164, 166). Further, the output frequency signal 104 of the SC oscillator 102 may also be provided to the phase lock loop 178 as a reference signal. The phase lock loop 178 may be configured for receiving the output frequency signal 104 and the second microcontroller output signal. Still further, based upon the received output frequency signal 104 and the second microcontroller output signal, the phase lock loop 178 may provide a phase lock loop output signal 180 to a voltage controlled oscillator 182 (ex.—a 3.41734274 Gigahertz (GHz)) voltage controlled oscillator 182.

In the illustrated embodiment, the voltage controlled oscillator (VCO) 182 may be configured for receiving the phase lock loop output signal 180 and, based upon the received phase lock loop output signal 180, the VCO 182 may be further configured for providing a VCO output frequency signal 184 to the Bias T 174. Further, the VCO output frequency signal 184 may also be provided to the phase lock loop 178. Once the VCO output frequency signal 184 is provided to the phase lock loop 178 (ex.—via feedback circuitry), the phase lock loop 178 may, based upon said VCO output frequency signal 184, provide an adjusted phase lock loop output signal to the VCO 182. The VCO 182 may be configured for receiving the adjusted phase lock loop output signal and, based upon the received adjusted phase lock loop output signal, the VCO 182 may be configured for providing an adjusted VCO output frequency signal to the Bias T. In this manner, as described above, the phase lock loop 178 may make adjustments based on feedback received via the feedback circuitry, to cause the VCO 182 to output a desired output frequency signal/a desired RF modulation signal/desired RF sweep. The phase lock loop 178, the VCO 182, the Bias T 174 and the second DAC 170 may be implemented with/as part of a physics package reference board.

In exemplary embodiments, the Bias T 174 may be configured for receiving the second DAC output signal 172 and the VCO output frequency signal(s) (184), and for providing a Bias T output signal 190 based upon the second DAC output signal 172 and the VCO output frequency signal(s) (184). For example, the Bias T output signal 190 may be a VSCEL Bias and Modulation signal provided to the physics package 126. Further, the physics package 126 may be configured for receiving the Bias T output signal 190, said received Bias T output signal promoting attainment by the physics package 126 of a desired resonance (ex.—CPT resonance). The microcontroller 122 may be configured for determining, based upon received outputs provided by the amplifier circuit 132, when a desired resonance of the physics package 126/CSAC has occurred and will lock to said resonance/resonance frequency. Still further, the microcontroller 122 may be configured for providing a resonance lock frequency output via the one or more control lines 162 to a third DAC 194, the third DAC 194 configured for receiving the resonance lock frequency output, and for providing an output signal to the VCXO 106, said third DAC's output signal based upon said received resonance lock frequency output. The VCXO 106 is configured for receiving the third DAC's output signal, and based upon said third DAC's output signal, said VCXO 106 is configured for outputting/providing a CSAC-based output frequency signal 197 for the architecture 100 for use by a system implementing said architecture 100.

In further embodiments, the SC oscillator 102 is configured for providing a temperature indicator signal 198 to a temperature sensor 200 of the architecture 100. The temperature sensor 200 is configured for receiving the temperature indicator signal 198 and, based upon the received temperature indicator signal 198, the temperature sensor 200 is further configured for providing a temperature sensor output 202 to a fourth ADC 204. The fourth ADC 204 is configured for receiving the temperature sensor output 202 and, based upon said temperature sensor output 202, the fourth ADC 204 is configured for providing an output 206 to the microcontroller 122 via the one or more control lines 162. Based upon the fourth ADC's output 206, the above-mentioned stored temperature characteristics of the SC-cut reference oscillator crystal 102, the mixer output 120, and the SC oscillator output 104, the microcontroller 122 may be configured for providing an TCCO-based output frequency adjustment signal 208 to the third DAC 194 via the one or more control lines 162. Still further, the third DAC 194 may be configured for receiving the TCCO-based output frequency adjustment signal 208 and, based upon the received TCCO-based output frequency adjustment signal 208, the third DAC 194 may be configured for providing a frequency adjustment output signal 210 to the VCXO 106. The VCXO 106 may be configured for receiving the frequency adjustment signal 210, and, based upon said frequency adjustment signal 210, the VCXO 106 may be configured for providing a TCCO-based output frequency 212 for the architecture 100 for use by a system implementing said architecture 100.

In exemplary embodiments, the CTFS 100 of the present invention may be implemented in a system which may interface with standard military GPS receivers. The CTFS 100 may allow for output of precise time and frequency information from the system to other connected systems, even in the absence of GPS availability. By combining the advantages of both atomic time standards and quartz crystal frequency standards, the CTFS 100 may allow the system in which it is implemented to achieve high stability at both short-time scales and long-time scales (ex.—less than 1 microsecond/day time error with phase noise below −98 dBc/Hz at 10 Hz offset). This capability may result in significant improvements in operational performance and robustness for a broad range of Command, Control, Communications, Computers, Intelligence, Surveillance and Reconnaissance (C4SR) systems that rely on the GPS time base. Immediate tangible impacts may include faster acquisition of position, network connectivity, and communications/data links.

Further, the CTFS 100 disclosed herein, by integrating the TCCO-based crystal oscillator and control electronics (ex.—TCCO ASIC 124), may provide levels of performance and functionality beyond that of conventional CSACs designed strictly for timekeeping applications. A first advantage which may be provided by the CTFS 100 may be fast warm-up. For example, the CTFS 100 may be on frequency within 15 seconds from cold start. This may allow the CTFS 100 to rapidly achieve precise frequency lock while the CSAC physics package heaters are stabilizing, thereby reducing the time for the CTFS 100 to become operational from minutes (in the present CSACs) to seconds (in the CTFS). A second advantage which may be provided by the CTFS 100 may be extended frequency stability over temperature. For instance, the extended temperature range of fielded TCCO units (−55 to +105 degrees Celsius) may ensure reliable operation of the CTFS 100 over a full target temperature range of −55 to +105 degrees Celsius and may provide robustness to excursions at the extremes. The TCCO/TCCO ASIC 124 may provide exceptional frequency stability over temperature through the use of digital compensation techniques. In combination with the CSAC (ex.—physics package 126), frequency change may be predicted with temperature of only $1 \times 10^{-9}$ over the −55 to +105 degrees Celsius operating range.

A third advantage which may be provided by the CTFS 100 may be excellent phase noise. For instance, the TCCO circuitry 124 has been developed for communications applications requiring low phase noise and spurious. Thus, the embodiments of the CTFS 100 disclosed herein may provide up to 23 dBc/Hz better phase noise than previous CSAC modules designed strictly for timekeeping. Further, the CTFS 100, when implemented in a system/module/radio system may allow said module to operate as a frequency standard in performance-driven system applications. In the CTFS 100 of the embodiments of the present invention, digital compensation and use of digital signal processing techniques may result in phase noise performance comparable to an Oven Compensated Crystal Oscillator (OCXO), but without the large size and high power of the OCXO. A further advantage of the CTFS 100 of the present invention is its low power consumption. For instance, by using microcontroller-based digital frequency compensation in place of power-intensive ovenized oscillators, the CTFS 100 may allow for the system (ex.— time and frequency module) in which it is implemented to operate at only 25% to 50% of a 1 Watt power objective, while retaining excellent frequency characteristics. A still further advantage provided by the CTFS 100 disclosed herein may be its inherent flexibility. For example, the microcontroller-based circuit architecture may provide the ability to adapt and control interface functions through software definition without hardware changes, thereby optimizing utility of the system/module in which the CTFS 100 is implemented to a broad range of missions and concepts of operation.

In further embodiments, the CTFS 100 of the present invention may provide Allen Deviation of $6.4\times10^{-12}$ (1 hr) and uncorrected long-term aging below $1\times10^{-11}$/day. In exemplary embodiments, the CTFS 100 may be configured as a hermetic, shielded enclosure/module containing the above-referenced elements of the CTFS 100 (ex.—the physics package/CSAC physics package 126, the physics package reference board/phase lock loop daughterboard, the amplifier circuit/photodetector daughterboard, control electronics, etc.).

Referring to FIGS. 2A-2D, a flowchart illustrating a method for providing a frequency output via the CTFS architecture (described above) in accordance with an exemplary embodiment of the present invention is shown. The method 300 may include the step of providing an output frequency signal from an SC oscillator to both a first NOT gate and to a microcontroller 302. For example, the SC oscillator output frequency signal may be provided to the microcontroller as a microcontroller clocking signal for the microcontroller. The method 300 may further include the step of providing an output frequency signal from a VCXO to a second NOT gate 304. For example, the output frequency signal from the VCXO may be the output frequency signal for the architecture. The method 300 may further include the step of receiving the SC oscillator output frequency signal at the first NOT gate and, based upon the received SC oscillator output frequency signal, providing an output from the first NOT gate to a mixer 306. The method 300 may further include the step of receiving the VCXO oscillator output frequency signal at the second NOT gate and, based upon the received VCXO oscillator output frequency signal, providing an output from the second NOT gate to the mixer 308. The method 300 may further include the step of receiving the first NOT gate output and the second NOT gate output at the mixer and, based upon the received first NOT gate output and the received second NOT gate output, providing a mixer output to the microcontroller 310. For example, the mixer output may be provided to the microcontroller as a timer input signal for the microcontroller.

The method 300 may further include the step of providing a temperature indicator signal from the SC oscillator to a temperature sensor 312. For example, the temperature indicator signal may indicate temperature conditions under which the SC oscillator is operating. Further, the temperature indicator signal may be dynamically provided to the temperature sensor as a manner of providing an updated indication of temperature conditions. The method 300 may further include the step of receiving the temperature indicator signal at the temperature sensor and, based upon the received temperature indicator signal, providing a temperature sensor output to a first ADC 314. For instance, the temperature sensor output may provide a current/updated operating temperature for the SC Oscillator. The method 300 may further include the step of receiving the temperature sensor output at the first ADC and, based upon the received temperature sensor output, providing an ADC output signal from the first ADC to the microcontroller 316. The method 300 may further include the step of receiving the ADC output signal at the microcontroller and, based upon the received ADC output signal, providing a TCCO-based output frequency adjustment signal from the microcontroller to a first DAC 318. For example, the microcontroller may determine, based upon: the received ADC output signal (which includes temperature condition information/the current operating temperature for the SC oscillator); the received SC oscillator output frequency signal; the received mixer output; and the stored temperature characteristics of the SC oscillator, if and to what degree a change in operating temperature has induced changes in the VCXO output frequency. Further, based on the determination made by the microcontroller, the microcontroller's TCCO-based output frequency adjustment signal may be provided and may cause the VCXO to provide an adjusted VCXO output frequency signal, which is corrected for temperature-induced changes in the output frequency signal(s) previously provided by the VCXO. For instance, the method 300 may further include receiving the TCCO-based output frequency adjustment signal from the microcontroller at the first DAC and, based upon the TCCO-based output frequency adjustment signal, the first DAC may provide a frequency adjustment signal to the VCXO 320. The method 300 may further include receiving the DAC-provided frequency adjustment signal at the VCXO and, based upon the DAC-provided frequency adjustment signal, providing an adjusted VCXO output frequency 322.

Thus, as set forth in the method 300 above, the architecture 100 of the present invention may provide a VCXO output frequency 108 based solely on interaction of the components of the TCCO ASIC (ex.—SC oscillator 102, the VCXO 106) with the microcontroller 122. For example, during initial power up, the CTFS 100 may be under crystal oscillator control for frequency correction. This characteristic allows for the CTFS to be functional and on-frequency within 15 seconds of a cold start. During this initial phase (ex.—when/ while the CTFS 100 is under crystal oscillator control for frequency correction), the microcontroller 122 may execute a slow warm-up on the ovens of a physics package 126 to limit the start-up power of the physics package heaters to only 25% above the power at stabilization and to limit maximum power requirements of a system in which the CTFS 100 may be implemented. The CSAC/CSAC portion/physics package 126 may then stabilize, do a calibration of the CTFS reference crystal, and synchronize with GPS Time of Day (TOD) and 1 Pulse Per Second (PPS) inputs to establish a precise time base. For instance, the method 300 may further include the step of providing an oven current output signal from the microcontroller to the physics package 324. The method 300 may further include receiving the oven current output signal at the physics package and, based upon/responsive to the received oven current output signal, providing a thermistor output signal from the physics package to the microcontroller 326. The method 300 may further include receiving the thermistor output signal at the microcontroller and adjusting oven current output signal outputs based upon the received thermistor output signal 328. Power usage during this initial phase may be from 274 milliwatts (mW) (ex.—when the Reference and Photo Detector interface is inactive) to 501 mW (ex.—when all interfaces are active).

In exemplary embodiments, the method 300 may further include, based upon the received oven current output signal, providing a photodetector output signal from the physics package to an amplifier circuit 330. For example, the photodetector output signal may provide a status indicator including atomic resonance information/CPT operation information for the physics package. The method 300 may further include receiving the photodetector output signal from the physics package at the amplifier circuit 332. The method 300 may further include amplifying, splitting, filtering, and converting the received photodetector output signal to provide an output signal(s) from ADCs of the amplifier circuit to the microcontroller, said output signal(s) being based upon the received photodetector output signal 334.

In further embodiments, the method 300 may further include receiving the output signal(s) of the amplifier circuit ADCs at the microcontroller and, based upon the received amplifier circuit ADC output signal(s), providing a first microcontroller output signal from the microcontroller to a second DAC and providing a second microcontroller output signal from the microcontroller to a phase lock loop 336. For instance, based upon atomic resonance information/CPT operation information/status information of the received amplifier circuit ADC output signals, the microcontroller may make a determination as to whether or not the desired atomic resonance has occurred within the physics package. Based on this determination, the microcontroller may: provide a signal to the second DAC (ex.—the first microcontroller output signal) and a signal to the phase lock loop (ex.—the second microcontroller output signal) for facilitating attainment by the physics package of a desired resonance/CPT resonance; and may cause the CTFS to continue to be under crystal oscillator control until the desired resonance/CPT resonance is achieved.

The method 300 may further include receiving the microcontroller's first output signal at the second DAC and, based upon the received first microcontroller output signal, providing an output signal from the second DAC to a Bias T 338. The method 300 may further include receiving the microcontroller's second output signal at the phase lock loop (ex.—which may be a 200 Hz dithered signal) and, based upon the received second microcontroller output signal and the SC oscillator output signal, providing an output signal from the phase lock loop to a VCO 340. The method 300 may further include receiving the output signal from the phase lock loop at the VCO and, based upon the received phase lock loop output signal, providing a VCO output signal to the Bias T and the phase lock loop 342. Further, the method 300 may include the step of, the phase lock loop, based on the received VCO output signal (ex.—which may be received by the phase lock loop from the VCO via feedback circuitry), providing a signal to the VCO for causing the VCO to provide/output an adjusted VCO output 344.

In exemplary embodiments, the method 300 may further include receiving the output signal from the VCO (ex.—an RF modulation/RF sweep signal) and the output signal from the second DAC (ex.—a current modulation signal) at the Bias T and, based upon said received signals, providing a Bias T output signal from the Bias T to the physics package 346. The method 300 may further include receiving the Bias T output signal at the physics package 348. For example, the Bias T output signal may be a VSCEL Bias and Modulation signal for promoting the occurrence of desired resonance/CPT resonance by the physics package. When desired resonance/CPT resonance is attained by the physics package, the architecture (ex.—microcontroller and CSAC) may lock to the desired resonance/CPT resonance. For example, the method 300 may further include providing an updated photodetector output signal to the amplifier circuit 350. For instance, the updated photodetector output signal may include a status indicator that the desired atomic resonance/CPT resonance has been achieved by the physics package. The method 300 may further include receiving the updated photodetector output signal at the amplifier circuit 352. The method 300 may further include amplifying, splitting, filtering, and converting the received updated photodetector output signal to provide updated output signal(s) from ADCs of the amplifier circuit to the microcontroller, said updated output signal(s) being based upon the received updated photodetector output signal 354. Lock of the CSAC may occur within about 3 minutes for cold start of a system implementing said CTFS.

The method 300 may further include receiving the updated output signal(s) of the ADCs at the microcontroller and, based upon the received updated ADC output signal(s), providing a first updated microcontroller output signal from the microcontroller to the second DAC and providing a second updated microcontroller output signal from the microcontroller to a phase lock loop 356. For instance, based upon atomic resonance information/CPT operation information/status information/status indicators of the received updated ADC output signals, the microcontroller may make a determination that the desired atomic resonance has occurred within the physics package and will thus, lock to this resonance. Based on this determination, the microcontroller may: provide a signal to the second DAC (ex.—the first updated microcontroller output signal) and a signal to the phase lock loop (ex.—the second updated microcontroller output signal) for facilitating maintenance by the physics package of the desired resonance/CPT resonance. Accordingly, since the desired resonance has been attained by the physics package/CSAC, the microcontroller may cause the CTFS to be placed under/switched to CSAC control. For instance, the method 300 may further include providing a CSAC-based output frequency adjustment signal to the first DAC 358. The method 300 may further include receiving the CSAC-based output frequency adjustment signal at the first DAC and, based upon the received CSAC-based output frequency adjustment signal, providing an analog CSAC-based output frequency adjustment signal from the first DAC to the VCXO 360. The method 300 may further include receiving the analog CSAC-based output frequency adjustment signal at the VCXO and, based upon the received analog CSAC-based output frequency adjustment signal, providing a CSAC-based VCXO output frequency 362. The CSAC-based VCXO output frequency may be the output frequency/the new output frequency for the CTFS. Thus, as described above, the CTFS 100 may selectively and/or dynamically switch/may be selectively and/or dynamically switched between being under CSAC control or crystal oscillator (TCCO-based) control for output frequency adjustment.

In exemplary embodiments, the CTFS 100 may be implemented in a system/module which may be designed to connect with an external GPS receiver and communicate Frequency, Time and Time Interval information with the GPS receiver, the CTFS 100, and external equipment via standard interface protocols. Status information may be communicated to indicate system operation. For example, indications communicated may include loss of lock in the physics package 126, heater stabilization, crystal oscillator status, and loss of lock of the phase lock loop 178. Individual interface logic of the system/module may be left in low power mode until a connection is made with a desired interface, thereby reducing overall power consumption of the system/module. For maximum flexibility for external system connections, multiple interfaces may be incorporated. A precise 10 MHz output may be generated from control circuitry of the CTFS 100 and may be available at a user interface as a 1 volt peak-to-peak at 50 ohms. This will be a high quality frequency signal comparable to that of precision frequency standards and may match the low phase noise and spurious characteristic of existing TCCO frequency standards.

The system/module in which the CTFS 100 may be implemented may be established in various operating modes. As mentioned above, the system/module and CTFS 100 may be established in a start-up/initial power-up mode. Further, the system implementing the above-described CTFS 100 may be established in a normal operating mode/normal run mode/normal mode, which may operate under conditions of continuous or intermittent GPS connectivity. The system may receive 1 PPS and TOD inputs from the GPS receiver and may preserve synchronization to those signals. The system may further monitor GPS lock indicators on an IS-GPS-153 interface and may automatically transition to CTFS-control when GPS timing is lost. In normal mode, the CSAC physics package may be powered continuously and may be available for immediate transition to CTFS control or to Low-Power Silent Watch mode. Power consumption may be dependent upon interfaces in use, as an interrupt-driven approach may power down interfaces and preserve minimum power until interface requests are made. Normal Power mode may be 496 mW when all interfaces to the system are active and may drop to 269 mW when the Reference Board and Photo Detector Board interface is inactive. When all interfaces are in standby, power consumption may be only 248 mW.

In additional embodiments, the system implementing the CTFS 100 may be established in low-power silent-watch mode which may allow for operation of the system in the absence of GPS connectivity. Low-power silent-watch mode may be enabled actively by user selection through the computer/microcontroller interface of/with the system. In low-power silent-watch mode, a precision time base may be maintained by the CTFS to enable rapid reacquisition of GPS upon transition back to Normal Mode, while power consumption may be minimized to avoid excessive drain on batteries of the system. During silent-watch mode, the interface microcontroller may be running at a reduced clock rate and user interfaces may be running in standby to conserve power, and yet may still remain able to monitor interface activity and respond if an interface connection is requested. In this mode, an average power consumption may be 198 mW. At said power levels, a total of 0.4 Amp-hours may be consumed over a 24 hour period with a 12-volt battery. This may be easily manageable within the capacity of a typical 12V/50 Ah vehicle battery, and may even be compatible with use in dismounted systems using typical tactical portable batteries. With a maximum uncorrected aging rate of the CSAC of $1\times10^{-11}$/day, the accumulated time error after a one-day period may be less than 0.9 microseconds. Aging correction algorithms may be implemented in the system to decrease time error to below 0.5 microsecond/day.

In further embodiments, hardware capability for an Ultra Low Power Mode operating mode may be incorporated into the design to provide continued operation under quartz crystal control for limited duration at very low power consumption. In Ultra Low Power Mode, a 32,768 Hertz crystal 214 may be implemented for driving the microcontroller 122 of the CTFS 100.

As mentioned above, the CSAC physics package 126 may include a thermally-biased VCSEL and Rb vapor cell, which may be stabilized to high precision using the above-described electronic control loops of the circuitry of the CTFS 100. Fundamental trades may be exercised in selecting appropriate bias temperatures. In the absence of active cooling (which would result in high power consumption), the CSAC may not operate at an ambient temperature above bias set points. Even at temperatures below the bias set points, control loop bandwidth may become so narrow as to preclude stable operation. In exemplary embodiments, the VCSEL and vapor cell of the physics package 126 may be biased to 95 degrees Celsius to enable the system in which the CTFS 100 is implemented to operate over the full –55 to +85 degrees Celsius temperature range. At upper operating temperature, there may be a 10 degrees Celsius or lower margin between the maximum ambient and control setpoint. Empirical data may be used to generate a detailed thermal model for the physics package 126, thereby enabling implementation of proportional controllers and the ability to maintain accurate oven control with a low temperature overhead. Further, at a bias temperature of 95 degrees Celsius, the VCSEL may incur a significant (ex.— 67%) reduction in lifetime relative to the nominal 80 degrees Celsius operation used in prior CSAC builds. However, the lifetime of the VCSEL may be well beyond 80,000 hours.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A method for providing a frequency output via a Chip Scale Atomic Clock (CSAC)-enabled Time and Frequency Standard (CTFS) architecture, the method comprising:
    providing an output frequency signal from a Stress Compensated (SC) oscillator to both a first NOT gate and to a microcontroller;
    providing an output frequency signal from a Voltage Controlled Crystal Oscillator (VCXO) to a second NOT gate;
    receiving the SC oscillator output frequency signal at the first NOT gate and, based upon the received SC oscillator output frequency signal, providing an output from the first NOT gate to a mixer;
    receiving the VCXO oscillator output frequency signal at the second NOT gate and, based upon the received VCXO oscillator output frequency signal, providing an output from the second NOT gate to the mixer; and
    receiving the first NOT gate output and the second NOT gate output at the mixer and, based upon the received first NOT gate output and the received second NOT gate output, providing a mixer output to the microcontroller.

2. A method for providing a frequency output as claimed in claim 1, further comprising:
    providing a temperature indicator signal from the SC oscillator to a temperature sensor;

receiving the temperature indicator signal at the temperature sensor and, based upon the received temperature indicator signal, providing a temperature sensor output to a first Analog-to-Digital converter (ADC); and receiving the temperature sensor output at the first ADC and, based upon the received temperature sensor output, providing an ADC output signal from the first ADC to the microcontroller.

3. A method for providing a frequency output as claimed in claim 2, further comprising:

receiving the ADC output signal at the microcontroller and, based upon the received ADC output signal, providing a Time Compensated Crystal Oscillator (TCCO)-based output frequency adjustment signal from the microcontroller to a first Digital-to-Analog converter (DAC);

receiving the TCCO-based output frequency adjustment signal from the microcontroller at the first DAC and, based upon the TCCO-based output frequency adjustment signal, providing a frequency adjustment signal from the first DAC to the VCXO; and receiving the DAC-provided frequency adjustment signal at the VCXO and, based upon the DAC-provided frequency adjustment signal, providing an adjusted VCXO output frequency.

4. A method for providing a frequency output as claimed in claim 3, further comprising:

providing an oven current output signal from the microcontroller to the physics package;

receiving the oven current output signal at the physics package and, based upon the received oven current output signal, providing a thermistor output signal from the physics package to the microcontroller; and receiving the thermistor output signal at the microcontroller and adjusting oven current output signal outputs based upon the received thermistor output signal.

5. A method for providing a frequency output as claimed in claim 4, further comprising:

based upon the received oven current output signal, providing a photodetector output signal from the physics package to an amplifier circuit;

receiving the photodetector output signal from the physics package at the amplifier circuit; and amplifying, splitting, filtering, and converting the received photodetector output signal to provide output signals from ADCs of the amplifier circuit to the microcontroller, said output signals being based upon the received photodetector output signal.

6. A method for providing a frequency output as claimed in claim 5, further comprising:

receiving the output signal(s) of the amplifier circuit ADCs at the microcontroller and, based upon the received amplifier circuit ADC output signals, providing a first microcontroller output signal from the microcontroller to a second DAC and providing a second microcontroller output signal from the microcontroller to a phase lock loop;

receiving the microcontroller's first output signal at the second DAC and, based upon the received first microcontroller output signal, providing an output signal from the second DAC to a Bias T;

receiving the microcontroller's second output signal at the phase lock loop and, based upon the received second microcontroller output signal and the SC oscillator output signal, providing an output signal from the phase lock loop to a voltage controlled oscillator (VCO).

7. A method for providing a frequency output as claimed in claim 6, further comprising:

receiving the output signal from the phase lock loop at the VCO and, based upon the received phase lock loop output signal, providing a VCO output signal to the Bias T and the phase lock loop;

based on the received VCO output signal, providing a signal from the phase lock loop to the VCO for causing the VCO to provide an adjusted VCO output; and receiving the output signal from the VCO and the output signal from the second DAC at the Bias T and, based upon said received signals, providing a Bias T output signal from the Bias T to the physics package.

8. A method for providing a frequency output as claimed in claim 7, further comprising:

receiving the Bias T output signal at the physics package;

providing an updated photodetector output signal from the physics package to the amplifier circuit, the updated photodetector output signal including a status indicator, said status indicator indicating that atomic resonance has been achieved by the physics package; and receiving the updated photodetector output signal at the amplifier circuit.

9. A method for providing a frequency output as claimed in claim 8, further comprising:

amplifying, splitting, filtering, and converting the received updated photodetector output signal to provide updated output signals from ADCs of the amplifier circuit to the microcontroller, said updated output signals being based upon the received updated photodetector output signal;

receiving the updated output signals of the ADCs at the microcontroller and, based upon the received updated ADC output signals, providing a first updated microcontroller output signal from the microcontroller to the second DAC and providing a second updated microcontroller output signal from the microcontroller to the phase lock loop; and providing a CSAC-based output frequency adjustment signal to the first DAC.

10. A method for providing a frequency output as claimed in claim 9, further comprising:

receiving the CSAC-based output frequency adjustment signal at the first DAC and, based upon the received CSAC-based output frequency adjustment signal, providing an analog CSAC-based output frequency adjustment signal from the first DAC to the VCXO; and receiving the analog CSAC-based output frequency adjustment signal at the VCXO and, based upon the received analog CSAC-based output frequency adjustment signal, providing a CSAC-based VCXO output frequency.

11. A method for providing a frequency output via a Chip Scale Atomic Clock (CSAC)-enabled Time and Frequency Standard (CTFS) architecture, the method comprising:

providing an output frequency signal from a Stress Compensated (SC) oscillator to both a first NOT gate and to a microcontroller;

providing an output frequency signal from a Voltage Controlled Crystal Oscillator (VCXO) to a second NOT gate;

receiving the SC oscillator output frequency signal at the first NOT gate and, based upon the received SC oscillator output frequency signal, providing an output from the first NOT gate to a mixer;

receiving the VCXO oscillator output frequency signal at the second NOT gate and, based upon the received VCXO oscillator output frequency signal, providing an output from the second NOT gate to the mixer;

receiving the first NOT gate output and the second NOT gate output at the mixer and, based upon the received first NOT gate output and the received second NOT gate output, providing a mixer output to the microcontroller;

providing a temperature indicator signal from the SC oscillator to a temperature sensor;

receiving the temperature indicator signal at the temperature sensor and, based upon the received temperature indicator signal, providing a temperature sensor output to a first Analog-to-Digital converter (ADC); and receiving the temperature sensor output at the first ADC and, based upon the received temperature sensor output, providing an ADC output signal from the first ADC to the microcontroller.

12. A method for providing a frequency output as claimed in claim 11, further comprising:

receiving the ADC output signal at the microcontroller and, based upon the received ADC output signal, providing a Time Compensated Crystal Oscillator (TCCO)-based output frequency adjustment signal from the microcontroller to a first Digital-to-Analog converter (DAC);

receiving the TCCO-based output frequency adjustment signal from the microcontroller at the first DAC and, based upon the TCCO-based output frequency adjustment signal, providing a frequency adjustment signal from the first DAC to the VCXO; and receiving the DAC-provided frequency adjustment signal at the VCXO and, based upon the DAC-provided frequency adjustment signal, providing an adjusted VCXO output frequency.

13. A method for providing a frequency output as claimed in claim 12, further comprising:

providing an oven current output signal from the microcontroller to the physics package;

receiving the oven current output signal at the physics package and, based upon the received oven current output signal, providing a thermistor output signal from the physics package to the microcontroller; and receiving the thermistor output signal at the microcontroller and adjusting oven current output signal outputs based upon the received thermistor output signal.

14. A method for providing a frequency output as claimed in claim 13, further comprising:

based upon the received oven current output signal, providing a photodetector output signal from the physics package to an amplifier circuit;

receiving the photodetector output signal from the physics package at the amplifier circuit; and amplifying, splitting, filtering, and converting the received photodetector output signal to provide output signals from ADCs of the amplifier circuit to the microcontroller, said output signals being based upon the received photodetector output signal.

15. A method for providing a frequency output as claimed in claim 14, further comprising:

receiving the output signal(s) of the amplifier circuit ADCs at the microcontroller and, based upon the received amplifier circuit ADC output signals, providing a first microcontroller output signal from the microcontroller to a second DAC and providing a second microcontroller output signal from the microcontroller to a phase lock loop;

receiving the microcontroller's first output signal at the second DAC and, based upon the received first microcontroller output signal, providing an output signal from the second DAC to a Bias T;

receiving the microcontroller's second output signal at the phase lock loop and, based upon the received second microcontroller output signal and the SC oscillator output signal, providing an output signal from the phase lock loop to a voltage controlled oscillator (VCO).

16. A method for providing a frequency output as claimed in claim 15, further comprising:

receiving the output signal from the phase lock loop at the VCO and, based upon the received phase lock loop output signal, providing a VCO output signal to the Bias T and the phase lock loop;

based on the received VCO output signal, providing a signal from the phase lock loop to the VCO for causing the VCO to provide an adjusted VCO output; and receiving the output signal from the VCO and the output signal from the second DAC at the Bias T and, based upon said received signals, providing a Bias T output signal from the Bias T to the physics package.

17. A method for providing a frequency output as claimed in claim 16, further comprising:

receiving the Bias T output signal at the physics package;

providing an updated photodetector output signal from the physics package to the amplifier circuit, the updated photodetector output signal including a status indicator, said status indicator indicating that atomic resonance has been achieved by the physics package; and receiving the updated photodetector output signal at the amplifier circuit.

18. A method for providing a frequency output as claimed in claim 17, further comprising:

amplifying, splitting, filtering, and converting the received updated photodetector output signal to provide updated output signals from ADCs of the amplifier circuit to the microcontroller, said updated output signals being based upon the received updated photodetector output signal;

receiving the updated output signals of the ADCs at the microcontroller and, based upon the received updated ADC output signals, providing a first updated microcontroller output signal from the microcontroller to the second DAC and providing a second updated microcontroller output signal from the microcontroller to the phase lock loop; and providing a CSAC-based output frequency adjustment signal to the first DAC.

19. A method for providing a frequency output as claimed in claim 18, further comprising:

receiving the CSAC-based output frequency adjustment signal at the first DAC and, based upon the received CSAC-based output frequency adjustment signal, providing an analog CSAC-based output frequency adjustment signal from the first DAC to the VCXO; and receiving the analog CSAC-based output frequency adjustment signal at the VCXO and, based upon the received analog CSAC-based output frequency adjustment signal, providing a CSAC-based VCXO output frequency.

20. A Chip Scale Atomic Clock (CSAC)-enabled Time and Frequency Standard (CTFS) architecture, comprising:

a microcontroller;

a Time Compensated Crystal Oscillator (TCCO) circuit, the TCCO circuit being connected to the microcontroller; and a Chip Scale Atomic Clock (CSAC), the CSAC being connected to the microcontroller, wherein the microcontroller is configured for selectively causing the CTFS architecture to provide a TCCO circuit-based output frequency when the CTFS architecture has not locked to a predetermined atomic resonance, and is further configured for causing the CTFS architecture to provide a CSAC-based output frequency when the CTFS architecture has locked to a predetermined atomic resonance.

* * * * *